United States Patent [19]

Holmberg et al.

[11] Patent Number: 4,820,222

[45] Date of Patent: Apr. 11, 1989

[54] METHOD OF MANUFACTURING FLAT PANEL BACKPLANES INCLUDING IMPROVED TESTING AND YIELDS THEREOF AND DISPLAYS MADE THEREBY

[75] Inventors: Scott H. Holmberg; Richard A. Flasck, both of San Ramon, Calif.

[73] Assignee: Alphasil, Inc., Fremont, Calif.

[21] Appl. No.: 948,224

[22] Filed: Dec. 31, 1986

[51] Int. Cl.⁴ .............................................. G09G 3/22
[52] U.S. Cl. ...................................... 445/3; 340/784; 445/24; 437/8
[58] Field of Search ........................ 313/500; 340/784; 437/8; 445/3, 24, 25; 29/593

[56] References Cited

U.S. PATENT DOCUMENTS

| | | | |
|---|---|---|---|
| 3,701,184 | 10/1972 | Grier | 445/24 |
| 3,707,767 | 1/1973 | Quevrin | 437/8 X |
| 3,940,740 | 2/1976 | Coontz | 437/8 X |
| 4,368,523 | 1/1983 | Kawate | 358/236 X |
| 4,586,242 | 5/1986 | Harrison | 437/8 |
| 4,676,761 | 6/1987 | Poujois | 445/3 |
| 4,680,580 | 7/1987 | Kawahara | 340/784 |

Primary Examiner—Kenneth J. Ramsey
Attorney, Agent, or Firm—Silverman, Cass, Singer & Winburn, Ltd.

[57] ABSTRACT

Subdivided pixels are provided with interconnected and hence redundant row and column bus lines to reduce fatal defects. The respective redundant row and column lines also can be interconnected between subpixels to further reduce defects. One defective subpixel is generally an acceptable non-fatal defect, since the rest of the subpixels are still operative. The subpixels also can be formed with common row and column bus lines. The pixels or subpixels can be connected in a serial serpentine pattern to test all row or all column bus lines at once. After testing, the serial connections are broken.

31 Claims, 5 Drawing Sheets

METHOD OF MANUFACTURING FLAT PANEL BACKPLANES INCLUDING IMPROVED TESTING AND YIELDS THEREOF AND DISPLAYS MADE THEREBY

BACKGROUND OF THE INVENTION

The present invention pertains to improved flat panel displays and methods of making and testing the displays. More particularly, the present invention is directed to methods of increasing the manufacturing yields of flat panel display backplanes and the displays made therefrom.

In recent years there has been growing interest in flat panel displays, such as those which employ liquid crystals, electrochromic or electroluminescence, as replacements for conventional cathode ray tubes (CRT). The flat panel displays promise lighter weight, less bulk and substantially lower power consumption than CRT's. Also, as a consequence of their mode of operation, CRT's nearly always suffer from some distortion. The CRT functions by projecting an electron beam onto a phosphor-coated screen. The beam will cause the spot on which it is focused to glow with an intensity proportional to the intensity of the beam. The display is created by the constantly moving beam causing different spots on the screen to glow with different intensities. Because the electron beam travels a further distance from its stationary source to the edge of the screen than it does to the middle, the beam strikes various points on the screen at different angles with resulting variation in spot size and shape (i.e. distortion).

Flat panel displays are manufactured to be substantially free of such distortion. In the manufacture of flat panel displays the circuit elements are deposited and patterned, generally by photolithography, on a substrate, such as glass. The elements are deposited and etched in stages to build a device having a matrix of perpendicular rows and columns of circuit control lines with a pixel contact and control element between the control line rows and columns. The pixel contact has a medium thereon which is a substance that either glows (active) or changes its response to ambient light (passive) when a threshold voltage is applied across the medium control element. The medium can be a liquid crystal, electroluminescent or electrochromic materials such as zinc sulfide, a gas plasma of, for example, neon and argon, a dichloroic dye, or such other appropriate material or device as will luminesce or otherwise change optical properties in response to the application of voltage thereto. Light is generated or other optical changes occur in the medium in response to the proper voltage applied thereto. Each optically active medium is generally referred to as a picture element or "pixel".

The circuitry for a flat panel display is generally designed such that the flat panel timeshares, or multiplexes, digital circuits to feed signals to one row and column control line of the pixels at a time. Generally one driving circuit is used for each row or column control line. In this way a subthreshold voltage can be fed to an entire row containing hundreds of thousands of pixels, keeping them all dark or inactive. Then a small additional voltage can be supplied selectively to particular columns to cause selected pixels to light up or change optical properties. The pixels can be made to glow brighter by applying a larger voltage or current of a longer pulse of voltage or current. Utilizing liquid crystal displays (LCD's) with twisted nematic active material, the display is substantially transparent when not activated and becomes light absorbing when activated. Thus, the image is created on the display by sequentially activating the pixels, row by row, across the display. The geometric distortion described above with respect to CRT's is not a factor in flat panel displays since each pixel sees essentially the same voltage or current.

One of the major problems that arises with respect to the prior art method of manufacture of backplanes for active matrix displays (e.g. those employing thin film transistors at each pixel) is that they generally suffer production yield problems similar to those of integrated circuits. That is, the yields of backplanes produced are generally not 100% and the yield (percentage of backplanes with no defects) can be 0% in a worst case. High quality displays will not tolerate any defective pixel transistors or other components. Also, larger size displays are generally more desirable than smaller size displays. Thus, a manufacturer is faced with the dilemma of preferring to manufacture larger displays, but having to discard the entire product if even one pixel is defective. In other words, the manufacturer suffers a radically increased manufacturing cost per unit resulting from decreasing usable product yield.

These problems of increased cost and decreased yield are dramatically improved in the present invention by providing methods of manufacturing display backplanes and the resulting displays with a greatly reduced number of fatal defects.

SUMMARY OF THE INVENTION

There is provided improved methods of manufacturing backplanes and the resulting flat panel displays to greatly increase the manufacturing yield, decrease manufacturing costs and decrease the number of fatal display defects.

These improvements are accomplished by subdividing each of the backplanes and hence display pixels into two or more subpixels. Each subpixel is formed with its own row (gate) line and column (source) bus line. Each subpixel pair of bus row lines and each pair of bus column lines are connected at the opposite sides of the display to provide redundant bus row lines and bus column lines. A break in the row or column bus line therefore will not affect the operation of the display, because the pixel will receive current from the other interconnected end of the row or column bus line Further, by providing subpixels, a defective active device at a subpixel will result in less than the whole pixel being defective and hence can be an acceptable nonfatal defect increasing the display yields. Subpixels also can be formed with a common row and a common column bus line.

The cost of manufacturing the display backplanes and hence the displays also can be reduced by serial loop testing of the row and column bus lines during manufacture. Each of the row and column bus lines is serially interconnected in a serpentine fashion at the opposite edges of the display. This allows all the row and all the column bus lines to be tested merely by contacting the two free ends of each of the serially interconnected row and column bus lines. Further, by applying the proper voltage to the ends of both the row and column bus lines, all the pixels or subpixels will be activated to provide one whole display test of all the pixels or subpixels at once. After final testing, the row and bus column line interconnections are broken to complete the display.

DESCRIPTION OF THE PREFERRED EMBODIMENTS

Figure 1:
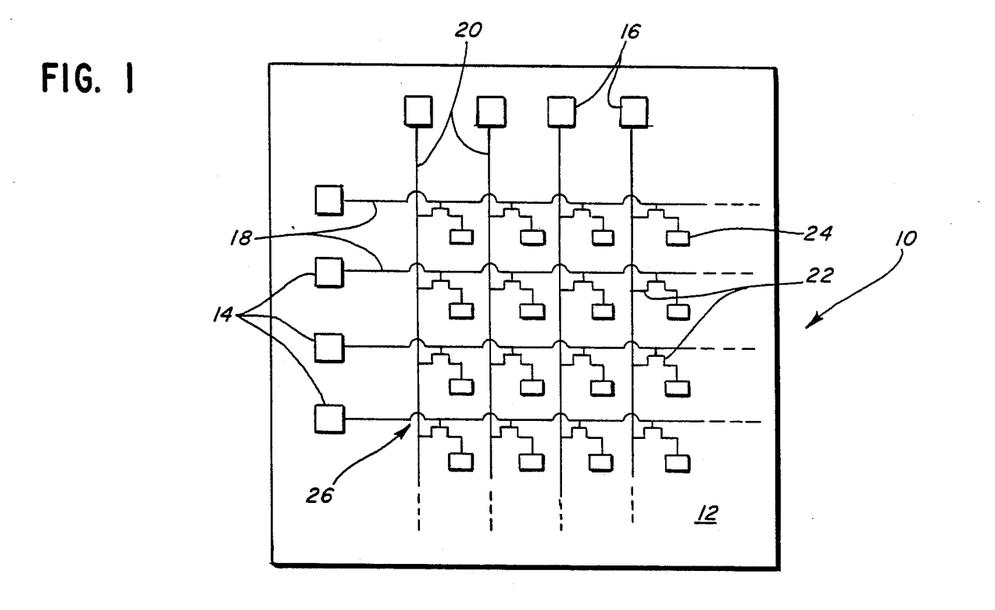
FIG. 1 is a plan view schematic representation of an active matrix display backplane made by a prior art method.

Referring now more particularly to FIG. 1, there is shown a schematic representation of an active matrix flat panel display device 10 made in accordance with conventional photolithographic techniques. One such device 10 and the manufacture thereof is more fully described in Application of Amorphous Silicon Field Effect Transistors in Addressable Liquid Crystal Display Panels, A. J. Snell, et al., *Applied Physics*, No. 24, p. 357, 1981. The device 10 includes a substrate 12, sets of contact pads 14 and 16, sets of control or bus lines 18 and 20, and, in this particular example of the prior art, transistors 22 and pixel back contacts 24.

The substrate 12 commonly employed in these devices is formed from glass. The control lines 18 and 20 are organized into a matrix of rows 18 and columns 20. The control line rows 18 in this device 10 serve as gate electrodes and the control line columns 20 as source connections. One contact pad 14 is connected to one end of each of the row control lines 18. One contact pad 16 is connected to one end of each of the column control lines 20. The display drive control (not shown) is connected to the sets of pads 14 and 16.

At each matrix crossover point 26, where a row line 18 and a column line 20 cross, a switching element, transistor 22 is formed to connect the row line 18 and column line 20 to the pixel back contacts 24. The active medium is deposited at least on the contacts 24 which will optically change properties in response to the combined voltages or currents in the respective crossover point 26 formed by the row 18 and column 20. The active medium at a given crossover point 26 will appear as a square or dot in the overall checkerboard type matrix of the display 10. The actual size of the transistors 22 and the contacts 24 are not now drawn to scale, but are shown schematically for illustration only.

It should be noted that theoretically there is no limit on the number of rows 18 and columns 20 that can be employed, only a portion of which are illustrated in FIG. 1. Therefore, there is also no theoretical limit on the outside dimensions of such a device 10. However, the present state of the lithographic art places a practical limit on the outside dimensions of these devices. The present alignment techniques generally allow high resolution display devices to be manufactured approximately five inches on a side 28, although improved techniques of up to fourteen inches on a side has been demonstrated.

The problem encountered by the prior art method of manufacture is that if the array of device 10 contains any defective pixel transistors 22 or other circuit elements causing a pixel to be inoperative, it must be discarded.

Figure 2:
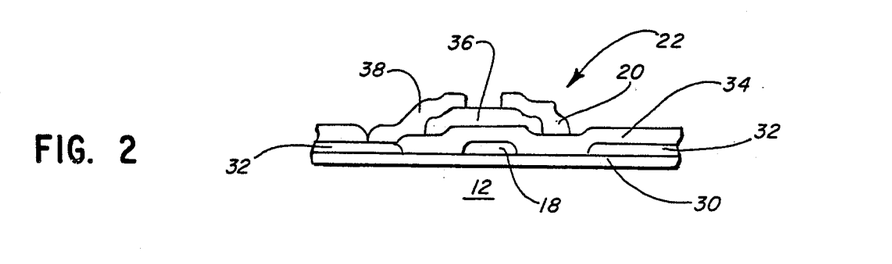
FIG. 2 is a cross-section of one transistor of the prior art backplane which could be utilized with the present invention.

Referring in detail to FIG. 2, several problems occur when the switching element, transistor 22 is manufactured. The substrate 12 is a substantial portion of the backplane cost and hence an inexpensive soda-lime glass is generally utilized. It has been demonstrated by liquid crystal display manufacturers that the high sodium concentration can poison the liquid crystal material by diffusing through the overlying ITO layer and hence an $SiO_2$ suppression layer 30 is generally formed on the substrate 12. There are some high quality low sodium types of substrates available, which would not need the suppression layer 30. An ITO layer 32 is formed and etched to provide an ITO free area on which the gate 18 is deposited. Following the deposition of the gate 18, a gate insulator layer 34 is deposited. Although a smooth uniform coverage of the gate 18 by the insulator 34 is illustrated, in production the gate 18 has or can have sharp edges which lead to pin holes or thinning of the insulator 34 at the gate edges. The source and drain metals can short to the gate 18. The thinning or pin holes produce transistors 22, which if operative, do not have uniform operating characteristics and hence the backplane is worthless.

One attempt to solve this problem, is to make the gate 18 very thin, but the resistivity is then too high to make the large arrays necessary for the backplane. A second attempt to solve the problem is to make the gate insulator 34 very thick, but this decreases the gain of the transistor 22 and is also self defeating.

An amorphous silicon layer 36 is then deposited, with the source 20 and a drain 38 deposited thereover. A passivating layer (not shown) would be deposited over the completed structure to complete the transistor 22. During operation the activation of the source 20 and the gate 18 couples power through the silicon alloy 36 to the drain and hence to the contact pad 24 formed by the ITO layer 32.

Figure 3:
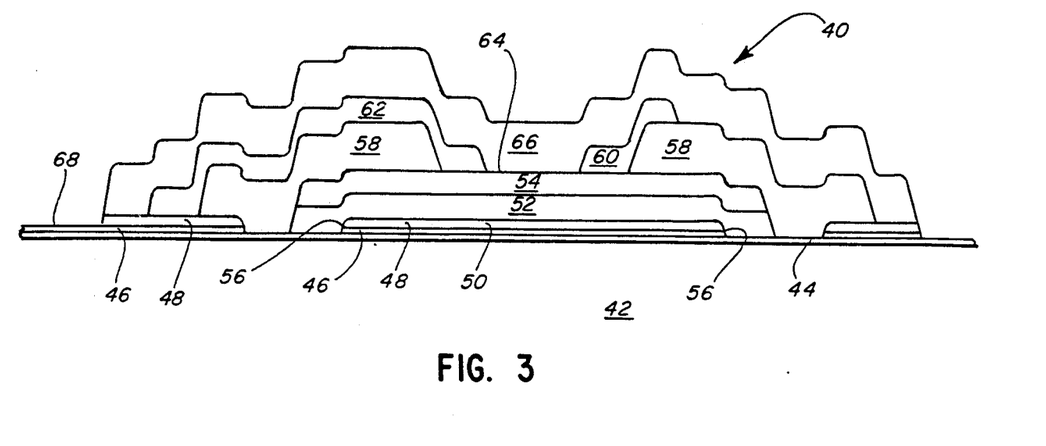
FIG. 3 is a cross-section of one transistor which could be utilized with the present invention.

Referring now to FIG. 3, there is shown a schematic representation of one embodiment of a transistor 40 which can be utilized with the present invention. The transistor is more fully disclosed in U.S. Pat. No. 4,545,112 and U.S. Ser. No. 493,523, which are incorporated herein by reference.

A glass substrate 42 includes a barrier $SiO_2$ layer 44 thereon. As above mentioned, a low sodium glass substrate, such as Corning 7059 glass, could be utilized, and hence the barrier layer 44 can be eliminated The detailed deposition steps are described in the abovereferenced patent and application. An ITO layer 46 is deposited and then a refractory metal layer 48 is deposited on the ITO layer 46.

The layers 46 and 48 are etched to form a gate electrode 50. A gate insulator 52 and a semiconductor material 54 are sequentially deposited over the gate 50. The material 54 preferably is an amorphous silicon alloy. To avoid the possibility of any gate to source or drain shorts at gate edges 56, a dielectric 58 is deposited over the gate 55, the gate insulator 52 and the semiconductor 54. The dielectric 58 is deposited to a sufficient thickness to ensure that no shorts or thin spots are formed between the edges 56 of the gate 50 and a source 60 and a drain 62 deposited thereover.

The dielectric 58 is etched away only on a substantially planar central region 64 of the semiconductor layer 54. This insures uniform operating characteristics for the transistors 40 in the backplane array. A passivating layer 66 is deposited over the whole structure to complete the structure of the transistor 40.

During all of the transistor processing steps, the refractory metal layer 48 remains over a pixel contact pad 68 upon which the active material of the pixel is deposited. As a final step, before the active medium (not shown) is added to the backplane to complete the display, the refractory metal is etched off of the pixel pad 68 leaving the ITO layer 46 exposed after all the processing has been completed.

Figure 4:
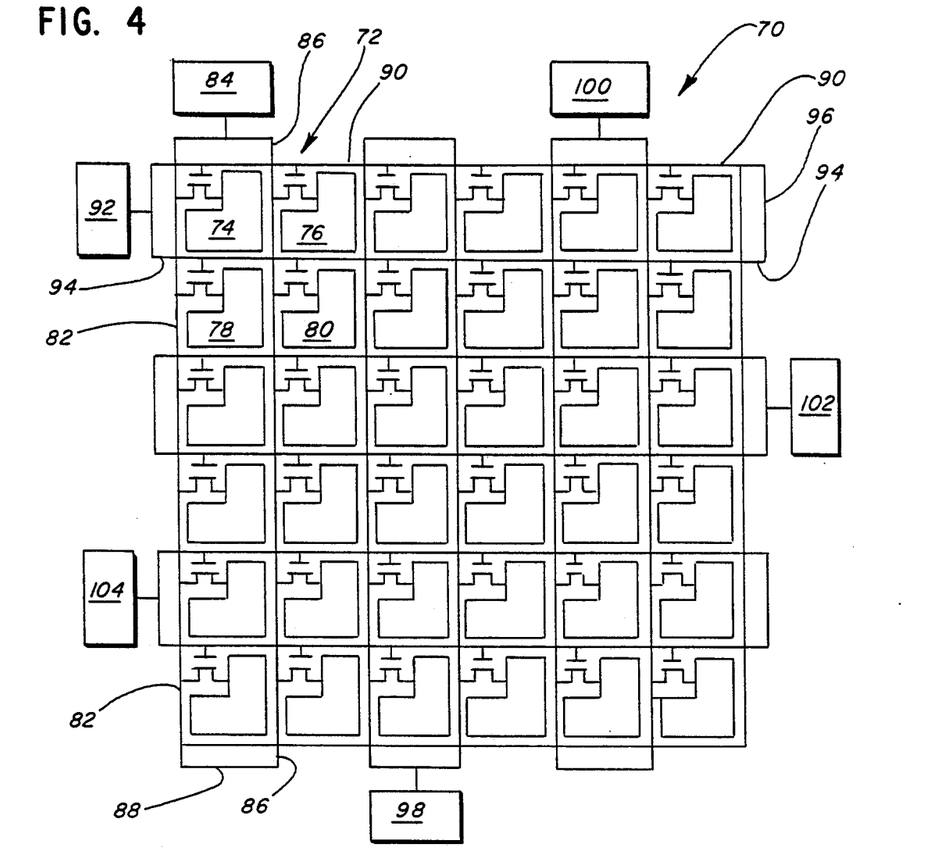
FIG. 4 is a plan view schematic representation of one embodiment of a subpixel matrix display of the present invention.

Referring now to FIG. 4, a subpixel matrix display of the present invention is designated generally by the reference numeral 70. The subpixel matrix display 70 is illustrated as having each pixel subdivided into four subpixels, but the pixels could be subdivided into numerous other configurations such as two subpixels, two by four subpixels or in three subpixels for color applications. Each pixel 72 is subdivided into four subpixels 74, 76, 78 and 80 (only one pixel 72 is so numbered for illustration). As previously stated, the number of pixels is merely shown for illustration purposes and the display 70 could contain any desired number and configuration, square or rectangular.

A column (source) line or bus 82 connects the subpixels 74 and 78 and all other column subpixel pairs in one-half of each of the pixels to a column or source contact pad 84 at one edge of the display 70. A second column (source) line or bus 86 connects the subpixels 76 and 80 and all other column subpixel pairs in the second half of each of the pixels to the column or source contact pad 84. The bus lines 82 and 86 are interconnected (shorted) at or before the pad 84 and are interconnected (shorted) at the opposite ends by a line or short 88.

A row (gate) line or bus 90 connects the subpixels 74 and 76 and all other row subpixel pairs in one-half of each of the pixels to a row (gate) pad 92. A second row (gate) line or bus 94 connects the subpixels 78 and 80 and all other row subpixel pairs in one-half of each of the pixels to the row pad 92. The bus lines 90 and 94 are interconnected (shorted) at or before the pad 92 and are interconnected (shorted) at the opposite ends by a line or short 96.

In a like manner, each of the other subpixel pairs are connected in columns to respective column (source) pads 98 and 100, etc. The pads 84, 98 and 100 are illustrated as being on opposite sides of the display to provide additional connecting space for the pads, however, they also could all be on one side as in the display 10.

Each of the other subpixel pairs also are connected in rows to respective row (gate) pads 102 and 104, etc.

The pixel 72 then is divided into four subpixels 74, 76 78 and 80 which allows for one of the subpixels to be defective, such as the subpixel 74, without causing a fatal defect, since the remaining three subpixels 76, 78 and 80 remain operative. In prior devices, the pixel 72 would be totally defective and hence the display 70 would be inoperable.

Further, one often fatal display defect is caused by a defect or open in one of the row or column bus lines which would cause the whole row or column to be out, again resulting in an inoperative display 70. With the respective subpixel pairs of row and column bus lines interconnected, however, an open in a bus line will at most cause one subpixel to be inoperative. An open in one or more of the bus lines between the subpixels will result in no defects, since the current is supplied from the opposite shorted end of the row or column bus line. Thus, the display 70 in effect has redundant row and column bus lines.

Figure 5:
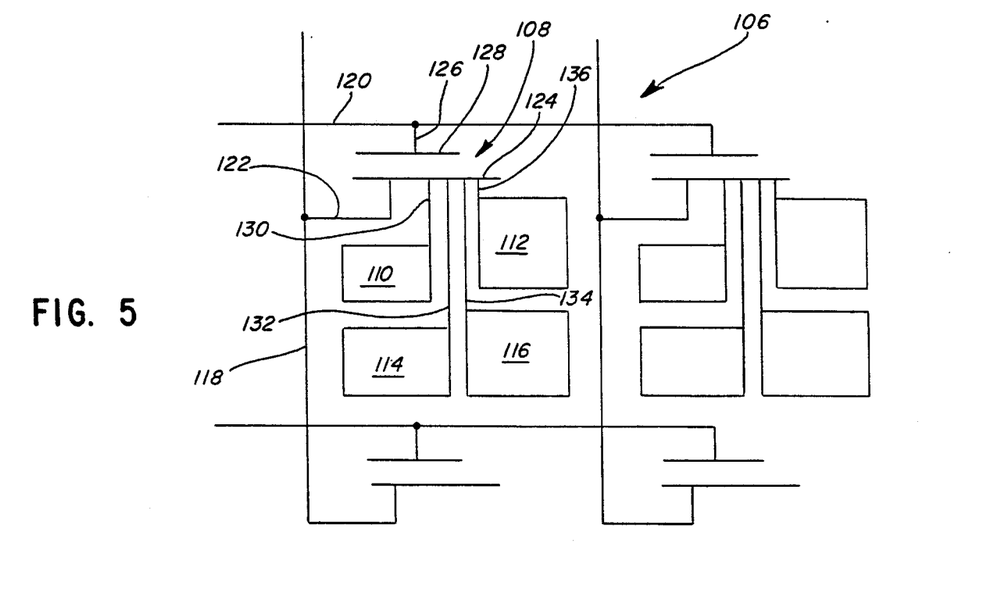
FIG. 5 is a plan view schematic representation of another embodiment of a subpixel matrix display of the present invention.

Referring to FIG. 5, a second embodiment of a subpixel matrix display of the present invention is designated generally by the reference numeral 106. Again, a pixel 108 is subdivided into a plurality of subpixels 110, 112, 114 and 116. In this embodiment, each of the subpixels 110, 112, 114 and 116 has a common column (source) line or bus 118 and a common row (gate) line or bus 120. The column bus line 118 is coupled by a source line 122 to a line 124, which is a schematic representation of a common source electrode. The row bus line 120 is coupled (schematically) by a line 126 to a line 128 which is a schematic representation of a gate electrode. Each of the subpixels 110, 112, 114 and 116 is coupled by a separate respective drain line 130 132, 134 and 136 to the (schematic) common source electrode 124. Since the drain lines 130, 132, 134 and 136 are small and formed close to one another to utilize the least space, a short in one of the lines, such as the drain line 130 causes only the subpixel 110 to be defective.

Figure 6:
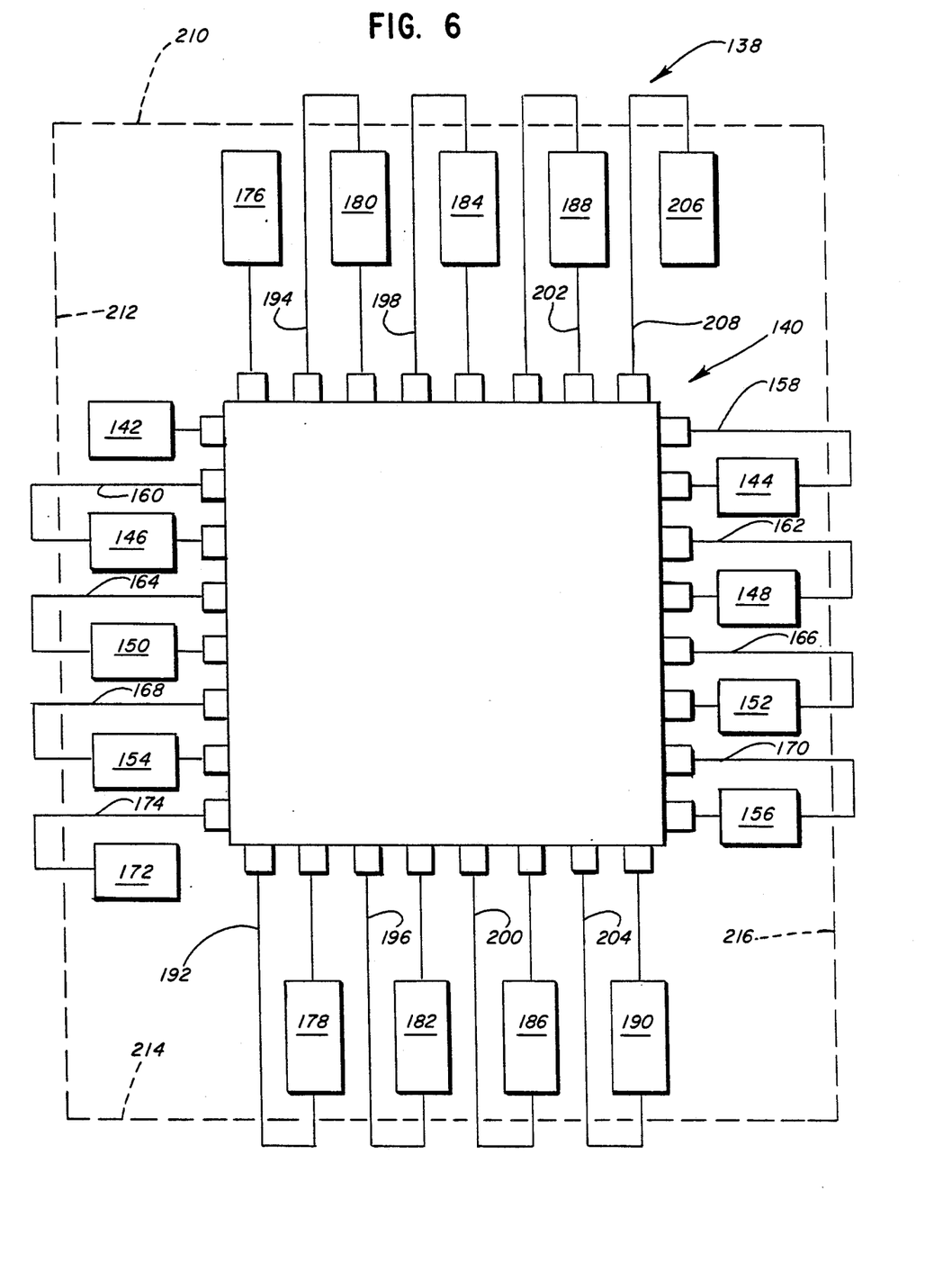
FIG. 6 is a plan view schematic representation of one embodiment of serial serpentine testing of the subpixel row and column bus lines in accordance with the present invention.

A flat panel backplane testing configuration is generally designated by the numeral 138 in FIG. 6. A flat panel backplane configuration 140 having subpixels similar to the display 70 of FIG. 4 includes a plurality of interconnected row (gate) lines or buses which are connected as described above to a plurality of row (gate) pads 142, 144, 146, 148, 150, 152, 154 and 156.

Additionally, each of the row pads 142, 144, 146, 148, 150, 152, 154 and 156 and hence each of the row (gate) lines or buses is interconnected in a serpentine fashion by respective lines or shorts 158, 160, 162, 164, 166, 168 and 170. In addition, to allow the testing of the last pair of row lines from the row pad 156, an additional or test row pad 172 is added to the test configuration 138, which is coupled to the last pair of row bus lines by a line 174.

Each of a pair of a plurality of interconnected column (source) lines or buses is connected to a respective column (source) pad 176, 178, 180, 182, 184 186 188 and 190 as described above. As with the row bus lines and pads, each column pad 176, 178, 180, 182, 184, 186, 188 and 190 is interconnected in a serpentine fashion by respective lines or shorts 192, 194, 196, 198, 200, 202 and 204. Again, to test the last pair of column bus lines, an additional or test column pad 206 is added to the test configuration 138, which is coupled to the last pair of column bus lines by a line 208.

As soon as the row bus lines (presuming the row bus lines are deposited first) are formed, all of the row bus lines can be tested merely by contacting two test points, the pads 142 and 172. In a like manner, the column bus lines can be tested simultaneously by contacting the two pads 176 and 206. The tests can be repeated as desired during the manufacturing process and appropriate repairs or termination of the manufacturing process can occur to reduce the manufacturing costs and to increase the yield of the completed display.

If the display is an inactive matrix without transistors or other active devices, then once the row and column bus lines have been tested as having continuity, then the serpentine interconnections are opened or broken to complete or allow completion of the display backplane. Preferably, especially where the devices are formed on glass, the interconnecting lines 158, 160, etc. and 192, 194, etc. extend beyond their respective pads, such that four scribe lines 210, 212, 214 and 216 intersecting all of the connecting lines can be formed. The glass substrate then is broken off along each of the scribe lines 210 212, 214 and 216 to terminate the test interconnections.

Where the subpixel display device 140 includes active devices, such as the transistors previously described, then the transistors also will be tested prior to terminating the interconnections. Further, if desired, the liquid crystal medium can be added and the whole display can be tested at once to see if all the pixels of the whole display 140 are operable prior to terminating the connections. In this case, one or both row pads 142 and 172 are contacted with an appropriate row or gate activation voltage.

In a like manner, one or both column pads 176 and 206 are contacted with an appropriate column or source activation voltage. Also, the backplane contact (not illustrated) is contacted with an appropriate activation voltage, which will activate all of the pixels for a visual test of the display device 140

Figure 7:
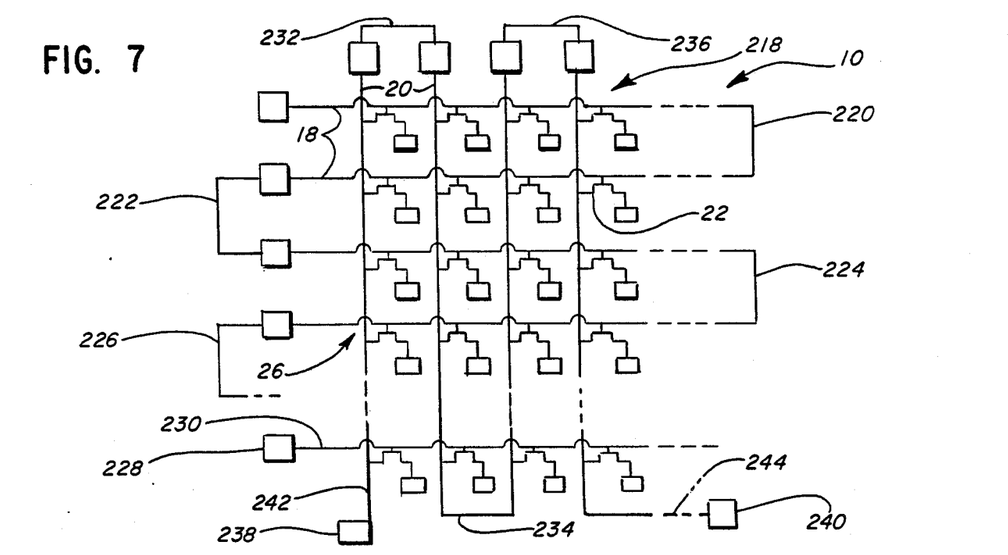
FIG. 7 is a plan schematic view of serial serpentine testing of conventional row and column bus lines in accordance with the present invention.

Referring to FIG. 7, the prior art device 10 (FIG. 1) is illustrated having a test configuration 218. The row bus lines 18 are interconnected in a serpentine fashion by a plurality of connecting lines 220, 222, 224 and 226 (partially shown). Depending upon the number of bus lines, the device 10 may not need an additional test pad, since the device ends in a pad 228 on the last row bus line 230. In a like manner, the column bus lines are interconnected in a serpentine fashion by a plurality of connecting lines 232, 234 and 236. If desired, or the configuration requires, a pair of column test pads 238 and 240 with respective connecting lines 242 and 244 are utilized to test the display 10 as described with respect to FIG. 6, prior to terminating or removing the connecting lines. Generally, the device 10 would be configured with the column pads all on the same side as illustrated for the row pads.

Figure 8:
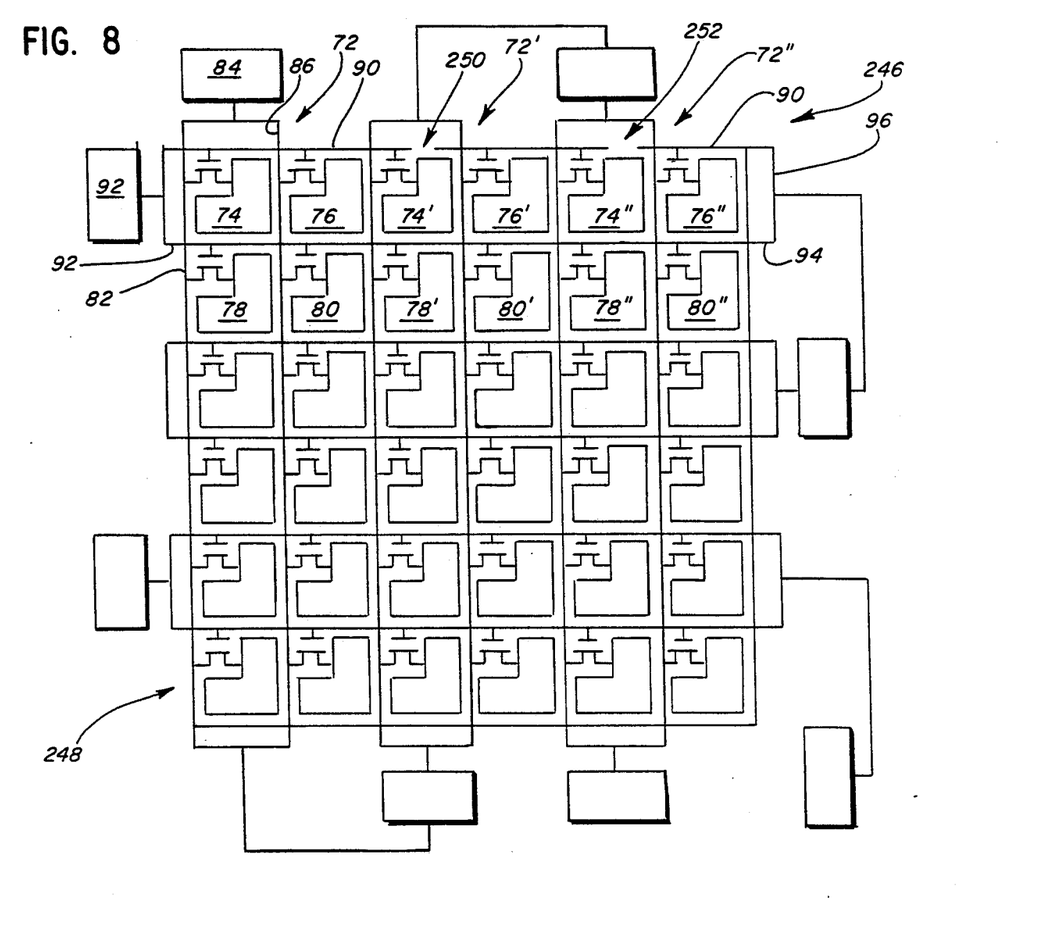
FIG. 8 is a plan view schematic of the subpixel matrix display of FIG. 4 with several row and column bus line defects or breaks therein.

Referring to FIG. 8, a test configuration 246 with a subpixel display 248 is best illustrated, which is similar to the display 70 of FIG. 4, with the serpentine test configuration of FIG. 6. Like numerals for the like parts from those described in FIG. 4, are utilized where appropriate. As described before, the redundant row bus lines 90 and 94 will provide the operating current to all the subpixels 74, 76, 74', 76', etc. if a single break or defect 250 occurs in one of the lines 90. In that case the row bus lines for the subpixels 74, 76 and 74' are fed from the pad 92 on one end of the bus line 90, while the subpixels 76', 74" and 76" are fed via the pad 92, the bus line 94 across the short 96 and via the other end of the bus line 90. If, however, a second break 252 occurs in the same bus line 90, then no current will be fed to the subpixels 76' and 74", which then are isolated. Two or more adjacent subpixels being inoperative generally would be a fatal defect and the redundant row bus lines 90 and 94 then would not be sufficient to save the display 248. In a like manner, two or more breaks in any of the row or column bus lines or pairs of bus lines generally will render the display inoperative.

Figure 9:
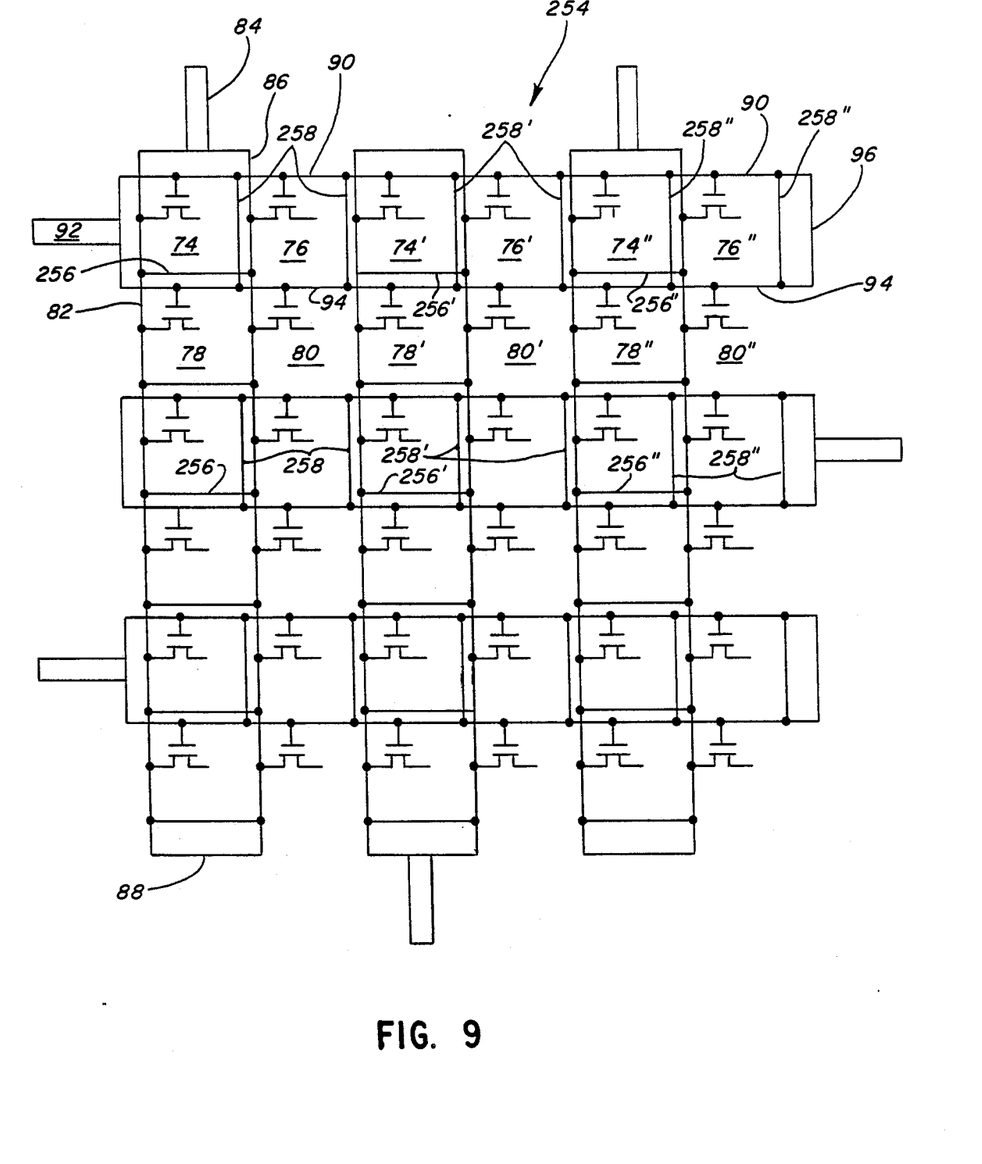
FIG. 9 is a plan view schematic of a subpixel matrix display of the invention similar to FIG. 8 with row and column bus line interconnections to avoid fatal defects caused by greater than one break in a particular row or bus column line.

To avoid the fatal defect of the multiple open lines another redundant display configuration is designated generally by the numeral 254 in FIG. 9. The redundant row and column bus lines are further interconnected in the display 254 at each subpixel to avoid the fatal defect illustrated in FIG. 8.

The display 254 is illustrated only with the bus line and interconnection patterns without the subpixels for clarity. Each pair of the column bus lines 82 and 86 are additionally interconnected between each of the subpixels 74, 78, etc. by respective lines or shorts 256, 256' and 256". In a like manner, each pair of the row bus lines 90 and 94 are interconnected between each of the subpixels 74, 76, etc. by respective lines or shorts 258.

With the additional interconnections 256 and 258, the previously fatal double open defects 250 and 252 do not cause the loss of any subpixels. The subpixels 76' and 74" now are fed via the bus line 94 and the short connecting line 258'. Therefore, the display 254 does not have any subpixel defects. Further, although both the row bus lines and the column bus lines have been illustrated as being interconnected between each subpixel, only one of the row or the column bus line sets might be shorted to limit the loss of active pixel display area.

Modification and variations of the present invention are possible in light of the above teachings. The transistors 22 or other types of two or three terminal switching devices can be utilized with the invention. The amorphous silicon alloy semiconductor material 54, could be any of numerous types of materials such as CdSe or GaAs materials. It is therefore to be understood that within the scope of the appended claims, the invention may be practiced otherwise than as specifically described.

What is claimed and desired to be secured by Letters Patent of the United States is:

1. A method of manufacturing matrix display backplanes and displays therefrom, comprising:
   providing a substrate;
   providing a pattern of pixels on said substrate; and
   providing a plurality of sets of intersecting pixel activation bus lines and coupling each said pixel to a pair of said sets of intersecting bus lines to provide each pixel with a redundant pair of activation bus lines, including connecting each of said pixels to one of its redundant pair of activation bus lines and interconnecting each end of said redundant pair of activation bus lines to one another to provide said redundancy and dividing each pixel into a plurality of subpixels and connecting each of said subpixels to one of its redundant pair of activation bus lines through an active device, independent of any other pixel activation bus lines.

2. The method as defined in claim 1 including interconnecting each of said redundant pair of activation bus lines between each of said pixels.

3. The method as defined in claim 1 including providing a redundant pair of row activation bus lines and a redundant pair of column activation bus lines for each of said pixels.

4. The method as defined in claim 3 including interconnecting at least one pair of said row and column lines between each of said pixels.

5. A display having dual bus lines, comprising:
a substrate;
a pattern of pixels formed on said substrate; and
a plurality of sets on intersecting pixel activation bus lines formed on said substrate and each said pixel coupled to a pair of said sets of intersecting bus lines to provide each pixel with a redundant pair of activation bus lines, including each of said pixels connected to one of its redundant pair of activation bus lines and each end of said redundant pair of activation bus lines interconnected to one another to provide said redundancy and each pixel divided into a plurality of subpixels and each of said subpixels connected to one of its redundant pair of activation bus lines through an active device, independent of any other pixel activation bus lines.

6. The display as defined in claim 5 including each of said redundant pair of activation bus lines interconnected between each of said pixels.

7. The display as defined in claim 5 including a redundant pair of row activation bus lines and a redundant pair of column activation bus lines connected to each of said pixels.

8. The display as defined in claim 7 including at least one pair of said row and column lines interconnected between each of said pixels.

9. A method of manufacturing matrix display backplanes and displays therefrom, comprising:
providing a substrate;
providing a pattern of pixels on said substrate;
providing a plurality of sets of intersecting pixel activation bus lines and coupling each said pixel to at least one of said sets of intersecting bus lines to provide each pixel with a set of activation bus lines;
forming said activation bus lines substantially orthogonal to one another in a plurality of rows and a plurality of columns of bus lines;
interconnecting opposite ends of each of said plurality of row bus lines in a serpentine fashion to serially connect substantially all of said row bus lines to one another;
interconnecting opposite ends of each of said plurality of column bus lines in a serpentine fashion to serially connect substantially all of said column bus lines to one another;
testing the continuity of substantially all of said plurality of row and column bus lines by contacting only two test points on each of said interconnected row and column bus lines as the backplanes are being manufactured; and
terminating substantially all of said interconnections after said bus lines are tested as having continuity to complete the manufacture of the backplanes and displays therefrom.

10. The method as defined in claim 9 including providing a plurality of sets of intersecting pixel activation bus lines and coupling each said pixel to a pair of said sets of intersecting bus lines to provide each pixel with a redundant pair of activation bus lines and interconnecting opposite ends of each respective pair of said plurality of row and column bus lines to test the continuity of said sets of row and column bus lines.

11. The method as defined in claim 10 including connecting each of said pixels to one of its redundant pair of activation bus lines and interconnecting each end of said redundant pair of activation bus lines to one another to provide said redundancy.

12. The method as defined in claim 11 including dividing each pixel into a plurality of subpixels and connecting each of said subpixels to one of its redundant pair of activation bus lines.

13. The method as defined in claim 12 including interconnecting at least one pair of said row and column lines between each of said pixels.

14. A display backplane having interconnections, comprising
a substrate;
a pattern of pixels formed on said substrate;
a plurality of sets if intersecting pixel activation lines formed on said substrate and each said pixel coupled to at least one of said sets of intersecting lines by an active device to provide each pixel with a set of activation lines;
said activation lines formed substantially orthogonal to one another in a plurality of rows and a plurality of columns of lines;
opposite ends of each of said plurality of row lines interconnected in a serpentine fashion to serially connect substantially all of said row lines to one another;
opposite ends of each of said plurality of column bus lines interconnected in a serpentine fashion to serially connect substantially all of said column bus lines to one another; and
a pair of test points on each of said row and said column bus lines.

15. The backplane as defined in claim 14 including a plurality of sets of intersecting pixel activation bus lines, each said pixel coupled to a pair of said sets of intersecting bus lines to provide each pixel with a redundant pair of activation bus lines and opposite ends of each respective pair of said plurality of row and column bus lines interconnected.

16. The backplane as defined in claim 15 including each of said pixels connected to one of its redundant pair of activation bus lines and each end of said redundant pair of activation bus lines interconnected to one another to provide said redundancy.

17. The backplane as defined in claim 16 including each pixel divided into a plurality of subpixels and each of said subpixels connected by an active device to one of its redundant pair of activation bus lines.

18. The backplane as defined in claim 17 including at least one pair of said row and column lines interconnected between each of said pixels.

19. A method of manufacturing matrix display backplanes and displays therefrom, comprising:
providing a substrate;
providing a pattern of pixels on said substrate;
subdividing each of said pixels into at least two subpixels; and
providing a plurality of sets of intersecting subpixel activation bus lines and coupling each said subpixel to at least one of said sets of intersecting bus lines to provide each subpixel with a set of activation bus lines through an active device, independent of any other pixel activation bus lines.

20. The method as defined in claim 19 including connecting each of said subpixels to one of its redundant pair of activation bus lines and interconnecting each end of said redundant pair of activation bus lines to one another to provide said redundancy.

21. The method as defined in claim 20 including interconnecting each of said redundant pair of activation bus lines between each of said subpixels.

22. The method as defined in claim 24 including interconnecting opposite ends of each of said plurality of row bus lines in a serpentine fashion to serially connect substantially all of said row bus lines to one another;
   interconnecting opposite ends of each of said plurality of column bus lines in a serpentine fashion to serially connect substantially all of said column bus lines to one another:
   testing the continuity of substantially all of said plurality of row and column bus lines by contacting only two test points on each of said interconnected row and column bus lines as the backplanes are being manufactured; and
   terminating substantially all of said interconnections after said bus lines are tested as having continuity to complete the manufacture of the backplanes and displays therefrom.

23. The method as defined in claim 22 including testing all of said subpixels by contacting said two row and said two column bus line test points.

24. The method as defined in claim 19 including providing a redundant pair of row activation bus lines and a redundant pair of column activation bus lines for each of said subpixels.

25. The method as defined in claim 24 including interconnecting at least one pair of said row and column lines between each of said subpixels.

26. A display backplane having subpixels, comprising:
   a substrate;
   a pattern of pixels formed on said substrate;
   each of said pixels subdivided into at least two subpixels; and
   a plurality of sets of intersecting pixel activation bus lines formed on said substrate and each said subpixel coupled to at least one of said sets of intersecting bus lines to provide each subpixel with a set of activation bus lines through an active device, independent of any other pixel activation bus lines.

27. The display as defined in claim 26 including each of said subpixels connected to one of its redundant pair of activation bus lines and each end of said redundant pair of activation bus lines interconnected to on another to provide said redundancy.

28. The display as defined in claim 27 including each of said redundant pair of activation bus lines interconnected between each of said subpixels.

29. The display as defined in claim 27 including opposite ends of each of said plurality of row bus lines interconnected in a serpentine fashion to serially connect substantially all of said row bus lines to one another; and
   opposite ends of each of said plurality of column bus lines interconnected in a serpentine fashion to serially connect substantially all of said column bus lines to one another.

30. The display as defined in claim 26 including a redundant pair of row activation bus lines and a redundant pair of column activation bus lines connected to each of said subpixels.

31. The display as defined in claim 30 including at least one pair of said row and column lines interconnected between each of said subpixels.

* * * * *